United States Patent [19]

Kuzuya et al.

[11] Patent Number: 5,049,922
[45] Date of Patent: Sep. 17, 1991

[54] IMAGE FORMING APPARATUS USING MASK ORIGINAL FORM

[75] Inventors: Susumu Kuzuya, Gifu; Takauni Sonoda, Toyoake; Kazunori Tanabe; Toshio Sakai, both of Nagoya; Hiroshi Taira, Ichinomiya; Tomoaki Hattori; Makoto Suzuki, both of Nagoya; Hidenori Hisada, Tokoname, all of Japan

[73] Assignee: Brother Kogyo Kabushiki Kaisha, Nagoya, Japan

[21] Appl. No.: 611,501

[22] Filed: Nov. 13, 1990

[30] Foreign Application Priority Data

Dec. 11, 1989 [JP] Japan .................. 1-321229

[51] Int. Cl.[5] .............. G03B 27/32; G03B 27/52; G03G 15/01
[52] U.S. Cl. ........................ 355/32; 355/27; 355/35; 355/326
[58] Field of Search ............ 355/32, 35, 88, 326; 358/300; 430/138; 346/105

[56] References Cited

U.S. PATENT DOCUMENTS

| 4,399,209 | 8/1983 | Sanders et al. | 430/138 |
| 4,647,182 | 3/1987 | Pierce | 355/32 X |
| 4,748,475 | 5/1988 | Ishiyama et al. | 355/27 |
| 4,810,614 | 3/1989 | Sangyoji et al. | 430/138 |
| 4,875,074 | 10/1989 | Sangyoji et al. | 355/27 |
| 4,884,082 | 11/1989 | Sonoda et al. | 346/105 |
| 4,920,374 | 4/1990 | Sangyoji et al. | 355/27 |
| 4,922,286 | 5/1990 | Tanabe | 355/27 |
| 4,932,068 | 6/1990 | Sonoda | 355/27 X |
| 4,933,708 | 6/1990 | Asano et al. | 355/32 |
| 4,942,419 | 7/1990 | Nakai et al. | 355/32 X |
| 4,949,185 | 8/1990 | Nakai | 358/300 |
| 4,967,227 | 10/1990 | Suzuki et al. | 355/88 X |
| 4,969,012 | 11/1990 | Suzuki et al. | 355/326 X |

FOREIGN PATENT DOCUMENTS

| 58-88739 | 5/1983 | Japan . |
| 62-143044 | 6/1987 | Japan . |
| 64-80542 | 3/1989 | Japan . |

Primary Examiner—Richard A. Wintercorn
Attorney, Agent, or Firm—Oliff & Berridge

[57] ABSTRACT

An image forming apparatus for forming an image on a photosensitive recording medium by exposing light by way of one of plural mask members which are selectively and consecutively placed on an exposure position. The apparatus includes a plurality of holding or retention positions linearly connected to the exposure position to which the mask members are selectively displaced. A transport device transports the mask members from the exposure position to the holding positions and vice versa.

17 Claims, 4 Drawing Sheets

IMAGE FORMING APPARATUS USING MASK ORIGINAL FORM

BACKGROUND OF THE INVENTION

1. Field of the Invention

The present invention relates to an image forming apparatus for exposing a photosensitive medium to light by way of a mask member.

2. Description of Related Art

An image forming apparatus is known which uses, for example as in U.S. Pat. No. 4,810,614, light transmitting sheets (hereinafter referred to as mask members) having images thereon in black that are obtained by taking out red, green and blue components of a colored original image. With the image forming apparatus, photosensitive recording paper to which color capsules are applied is sequentially exposed to filtered light by way of the three mask members to form an image.

FIG. 4 is a sectional view showing a part of the route transmitted by a mask member in an image forming apparatus of the type which have been proposed so far. A mask member 115R for red, another mask member 115G for green and a further mask member 115B for blue are formed by a laser printer or the like (not shown) and are inserted one by one into an inlet port 126 of the apparatus as shown in FIG. 4.

After the mask member 115R, for red, is inserted, it is transported downwardly to a left end of an endless belt 102 which extends in a horizontal direction. Endless belt 102 is formed from a transparent material and is electrically charged by a charging device (not shown). Thus, the mask member 115R is fixed to the endless belt 102 by force of static electricity and transported in the fixed condition by circulation of the endless belt 102. When the mask member 115R arrives at a predetermined exposure position, circulation of the endless belt 102 is stopped.

A photosensitive recording medium 106 drawn out from a cartridge 104 extends below and parallel to endless belt 102. A microcapsule paper, such as that disclosed in U.S. Pat. No. 4,399,209, may be adopted as the photosensitive recording medium 106. An exposure operation is performed while the photosensitive recording medium 106 and the mask member 115R are stopped opposed to one other at the exposure position. A lamp 108, serving as a light source for the exposure, is disposed above the endless belt 102 and three filters 110R, 110G and 110B for red, green and blue respectively are disposed below the lamp 108 such that they may selectively cover the lamp 108. Thus, the lamp 108 is first covered by the filter 110R for red. Lamp 108 and the filter 110R are integrally moved from a left end to a right end of the endless belt 102. Only the red component of the light from the lamp 108 is passed by the filter 110R and reaches the mask member 115R through the transparent endless belt 102. The red light component passes through the portion of the mask member 115R where there is no image or toner, that is at points that are not black, and is blocked by the black image portion of the mask member 115R. Consequently, the exposed surface of the photosensitive recording medium 106 is sensitized by red light in accordance with an image of the mask member 115R so that a latent image for red is formed thereon. After completion of such processing, the endless belt 102 is circulated to feed the mask member 115R to the right. The mask member 115R is fed out of the exposure position and transported upwardly along a route to the right of the apparatus as shown. The route branches into two routes at a position 114, the two routes leading to first and second buffers 116a and 116b. Mask member 115R is fed into the upper route by a gate 118 provided at the branching position 114 and consequently is stored in the first buffer 116a.

Simultaneous with such storage of the mask member 115R, the mask member 115G, for green, is inserted into the image forming apparatus through the inlet port 126. The mask member 115G is then transported along the same route previously transitted by the mask member 115R until it comes to the exposure position. It is to be noted that the photosensitive recording medium 106 is not transported during this operation. After the mask member 115G is positioned opposite to the photosensitive recording medium 106, the lamp 108 is moved from the left end to the right end of the endless belt 102 while covered by the filter 110G thereby performing an exposure operation with only green light.

After exposure of the photosensitive recording medium 106 with green light, the mask member 115G is transported rightwardly by circulation of the endless belt 102 and fed at the branching location 114 into the lower route by the gate 118 so that it is stored in the second buffer 116b. Simultaneously, the mask member 115B, for blue, is inserted and transported to the exposure position. An exposure operation of the photosensitive recording medium 106 with blue light is performed in a manner similar to that previously performed with red and green light.

Thus, latent images for red, green and blue are formed in an overlapping relationship on the same surface of the photosensitive recording medium 106 by the multiple exposure of the three exposure operations. The exposed portion of the photosensitive recording medium 106 is then transported to a developing station while a new portion of the photosensitive recording medium 106 is drawn out from the cartridge 104 and introduced to the exposure position at which it is opposed to the endless belt 102.

Meanwhile, the mask member 115B is transported rightwardly and introduced into the first buffer 116a by the gate 118. Simultaneously, the mask member 115R, which has been stored in the first buffer 116a, is transported leftwardly to rejoin the route from the inlet port 126 side so that it is again transported to the exposure position thereby reinitialing the exposure sequence. In this manner, the mask members 115 are successively transported to the exposure position while transitting a loop defined by the routes for mask member 115 movement provided in the apparatus. The gate 118 is controlled in accordance with the position of one of the buffers 116a and 116b in which a subsequently required mask member 115 is stored. After a predetermined number of images are formed in the manner described above, the mask members 115 are individually discharged by way of exit 120.

However, the apparatus described above, since the routes followed by the mask members 115 form a loop having many curved portions, is subject to sheet or mask member jamming.

Generally in an apparatus as used and described above, the device for producing the mask members (for example, a laser printer) is often placed on the upper portion of the apparatus. As a result, access to any such sheet jamming cannot be provided at a convenient upper portion of the exposure apparatus, the mask forming device being in the way. Because of this, a construction is commonly employed wherein the portion of the apparatus containing the routes followed by the mask members is constructed as a unit such that the unit can be extracted from the lower portion of the reproduction apparatus in order to allow clearance of such paper jams. Such a construction, however, requires a mechanism for extracting the mask member routing unit, and the balance of the apparatus is lost by the shifting weight when the mask member routing unit is extracted. Consequently, the entire reproduction apparatus becomes unstable, making the user uneasy.

SUMMARY OF THE INVENTION

Accordingly, it is an object of the present invention to provide an image forming apparatus in which sheet jamming is unlikely to take place, but should it occur, it can be easily handled because of a simplified structure and operation, and handling does not unbalance the reproduction apparatus so that the user does not become uneasy.

According to the present invention, there is provided an image forming apparatus to form an image on a photosensitive recording medium by exposure to light through one of a plurality of mask members sequentially placed on an exposure position, the apparatus comprising: a plurality of holding positions linearly connected to the exposure position to which the mask members are selectively moved; and transport means for transporting each of the mask members from the exposure position to the holding position and returning the mask member to the exposure position as appropriate.

BRIEF DESCRIPTION OF THE DRAWINGS

The above and other objects, features and advantages of the invention will become more apparent from reading the following description of the preferred embodiment taken in connection with the accompanying drawings in which.

DETAILED DESCRIPTION OF THE PREFERRED EMBODIMENTS

Hereinafter, an embodiment of the present invention will be described with reference to the drawings.

Figure 1:
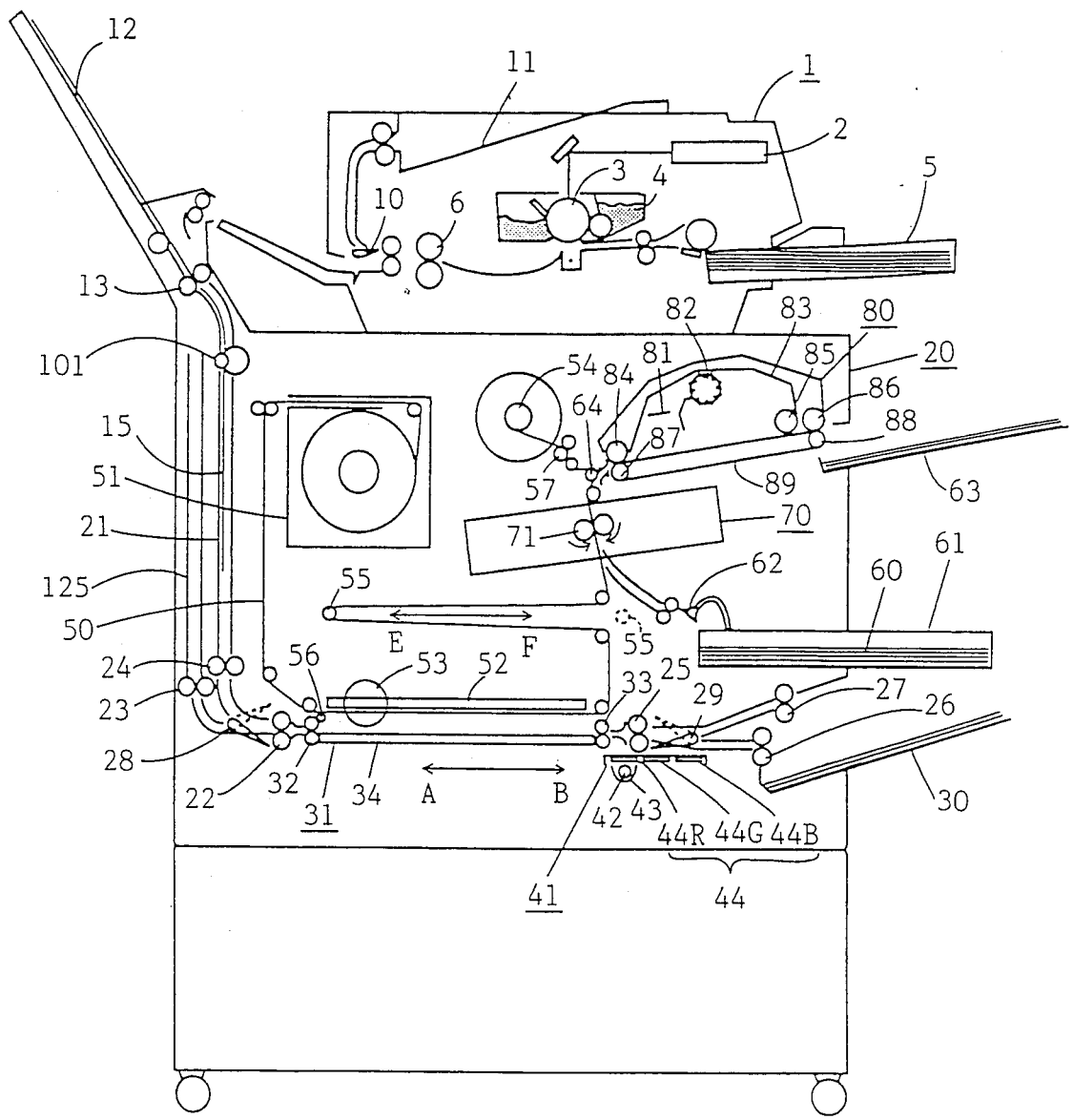
FIG. 1 shows an image forming apparatus according to one embodiment of the present invention.

FIG. 1 is a sectional view showing a monochromatic laser printer 1 and a color image recording apparatus 20 arranged in a coupled condition. The monochromatic laser printer 1 is placed on top of the color image recording apparatus 20.

In the laser printer 1, a laser beam is directed at an electrically charged photosensitive member or drum 3 by means of a polygon scanner 2 to form an electrostatic latent image on the photosensitive drum 3. The electrostatic latent image formed on the photosensitive drum 3 is then developed by a developing unit 4. A toner image formed by such development is transferred to a plain paper sheet or an overhead projector (transparent) sheet supplied from a sheet cassette 5. The toner image is then fixed to the sheet by a fixing unit 6. Normally, the monochromatic laser printer 1 records data transmitted from a host computer.

The sheet output from the laser printer 1 is directed into one of two routes by a sheet path selector 10. When a white/black image is required, the sheet is directed to a monochromatic discharge tray 11 or an automatic document feeder (hereinafter referred to as ADF) tray 12. When a color image is required, the sheet is directed first to the ADF tray 12 and then fed into the color image recording apparatus 20.

Sheets directed to the ADF tray 12 in this manner are then supplied, one by one, into the color image recording apparatus 20 by an ADF roller 13. A set of three such sheets, which have been output from the laser printer 1 and have monochromatic prints thereon, constitute a set of mask members 15 (15R, 15G and 15B) for subsequent use in the color image recording apparatus 20. Each of the mask members 15 thus output normally has a curl toward the side on which the image is formed. Correction of this curl will be addressed during the description of the color image recording apparatus 20.

The color image recording apparatus 20 has a positioning unit 31 disposed at a lower location in the body. A mask member transport path 21 extends from the ADF tray 12 to the positioning unit 31. Roller pairs 22, 23, 24, 25, 26 and 27, gates 28 and 29 for changing the mask member route, and a mask member accommodating section 125 are provided on the left and right sides, as shown in FIG. 1, of the positioning unit 31.

The roller pairs 22, 23, 24, 25, 26 and 27 are controlled to rotate forwardly and reversely by a microcomputer programmed to control the formation of the copy image. By such processing, a mask member 15 is advanced and returned along the transport path. Timings for the advance and return movement of a mask member 15 will be further described.

Figure 2:
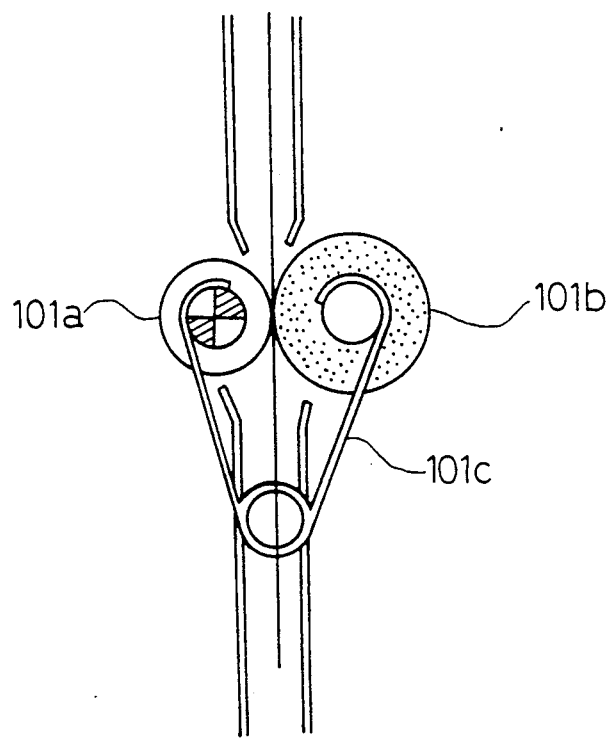
FIG. 2 is an enlarged side view of a pair of recurler rollers provided in the image forming apparatus.

A recurler roller pair 101 for removing a curl of a mask member 15 output from the laser printer 1 is disposed intermediate of the mask member transport path 1. The recurler roller pair 101 comprises a pair of rollers 101a and 101b and a spring 101c as shown in FIG. 2. Roller 101a has a higher hardness and a smaller diameter than the roller 101b. Roller 101b is made of a material which is relatively soft, such as foamed urethane rubber or the like, and has a larger diameter than the roller 101a.

Spring 101c urges the rollers 101a and 101b into resilient contact with one another. As a result of the urging force of the spring 101c, the surface of roller 101b resiliently yields to and is deformed by a predetermined amount by the outer circumferential face of the roller 101a. Further, the roller 101a is connected to a motor (not shown) from which it receives a rotational driving force.

A mask member discharge tray 30 for receiving a mask member 15 after use and discharge from the recording apparatus 20 is provided on the outer side of the roller pairs 26 and 27. The route traversed by mask member 15, including the roller pair 26, extends linearly in parallel to a face of glass plate 34. Further, the route that includes roller pair 27 also extends substantially linearly to a face of glass plate 34. Accordingly, jamming of a mask member 15 is unlikely along either of the routes.

The positioning unit 31 includes a sensor (not shown) for aligning the mask member 15, the roller pairs 32 and 33 disposed adjacent left and right end portions of the positioning unit 31, and a glass plate 34 disposed between the roller pairs 32 and 33. An exposure device 41 is disposed below the positioning unit 31 such that it is movable in leftward and rightward directions along the lower surface of positioning unit 31. Exposure device 41 comprises a linear white light source (hereinafter referred to only as lamp) 42, a reflecting member 43 for reflecting light from the lamp 42, and a filter unit 44 including a red filter 44R, a green filter 44G and a blue filter 44B.

A photosensitive recording medium 50 is composed of a web serving as a base material with a photosetting resin material and microcapsules applied to the web. The photosetting resin material contains, as a main material, a photopolymerization initiator as is known, for example, from Japanese Patent Laid-Open No. 143044/1987, and is hardened by light of the wavelengths for red, green and blue. The microcapsules individually contain dye precursors of cyan, magenta or yellow. The photosensitive recording medium 50 is mounted in a cartridge so that it is not exposed to light. The photosensitive recording medium 50 is drawn from the cartridge 51 and first passes between the glass plate 34 and an exposure table 52. It is wound around a takeup roller 54 after passing a buffer 55, a pressure developing unit 70, a separating roller 64 and a drive roller 57.

When an exposure operation is to be performed by the exposure device 41, exposure table 52 is moved down by a cam 53 so that a mask member 15, which has been transported onto the glass plate 34 by the roller pair 32, is closely contacted with the photosensitive recording medium 50. Meanwhile, a fastening roller 56 is located adjacent a left end of the exposure table 52 so that, when the exposure table 52 is moved down to a predetermined position, the fastening roller 56 is pressed against a left end portion of the exposure table 52. As a result, while an exposure operation is taking place using one of the mask members 15R, 15G or 15B, the photosensitive recording medium 50 is held between and fixed by the exposure table 52 and fastening roller 56.

Color developer sheets 60, comprised of sheets having a color developer as disclosed, for example, in Japanese Patent Laid-Open No. 88739/1983, are set in the cassette 61 such that the face to which the color developer is applied is directed downwardly. The color developer sheets 60 are supplied to the pressure developing unit 70 one by one from the cassette 61 by a suction cup 62 which is intermittently driven by a driving source (not shown). The color developer sheet 60 is pressured by a pair of pressure rollers 71 of the pressure developing unit 70 while it is held in an overlapping relationship with the photosensitive recording medium 50 that has been exposed to light. Consequently, the latent image formed on the photosensitive recording medium 50 by the exposure operation is changed into a visible image on the color developer sheet 60.

Comprising a thermal fixing unit 80 are a casing 83, having a heater 81 and a vane wheel 82 located therein at upper locations, rubber rollers 84, 85 and 86 for the transportation of a color developer sheet 60 at a lower location, and an endless belt 89 extending between a pair of rollers 87 and 88.

The color developer sheet 60 fed from the pressure developing unit 70, and separated from the photosensitive recording medium 50 by the separating roller 64, is then glazed by the thermal fixing unit 80 and discharged to discharge tray 63.

Operation of the image forming apparatus having the construction as described above, when a plurality of color outputs are to be obtained from a set of mask members 15, will now be described.

First, a mask member 15R for red is produced by the monochromatic laser printer 1. The mask member 15R is a mask member which has toner on those points where all microcapsules, containing dye precursors of yellow, cyan or magenta, are to remain unexposed or uncured and has clear areas to pass red light for curing or hardening the cyan microcapsules of the photosensitive recording medium 50. Subsequent actions, to be described, using mask members 15G and 15B with filters for providing green and blue light through the clear positions of the mask member will cure or harden the magenta and yellow microcapsules respectively. In this instance, the mask member 15R output from the monochromatic laser printer 1 is sent to the ADF tray 12 and from there supplied to the color image forming apparatus 20 by the ADF roller 13.

Mask member 15R, when it is supplied into the color image recording apparatus 20, has a curl to the side of sheet on which the image is formed. Mask member 15R follows the mask member transport path 21 and is fed to the recurler roller pair 101. Mask member 15R is thus recurled by the recurler roller pair 101 and then fed into the positioning unit 31 by the roller pairs 24 and 22. In this instance, the gate 28 remains at the position indicated by solid lines in FIG. 1.

Then, the positioning unit 31 transports the mask member 15R to the predetermined exposure position by the roller pair 32. Mask member 15R is accurately positioned by means of a driving source (not shown) using a positioning mark printed on the mask member 15R that is read by means of a sensor (not shown).

It is to be noted that immediately before such positioning is performed, the exposure table 52 is moved down to the predetermined position by the cam 53 until the left end portion thereof is contacted with the fastening roller 56 so that the photosensitive recording medium 50 is fixed to the exposure table 52. After completion of such positioning, the exposure table 52 is further moved down by cam 53 until it is in contact with the glass plate 34 of the positioning unit 31. In this position, the mask member 15R and the photosensitive recording medium 50 are in close contact with one other.

After the exposure table 52 is brought into close contact with the positioning unit 31, the lamp 42 is lit, with filter 44R in position over it, so that red light passes through the mask member 15R and irradiates the photosensitive recording medium 50. Since the exposure device 41 performs a scanning exposure in the direction indicated by arrow A, the entire photosensitive recording medium 50 on the exposure table 52 is exposed to the light. After completion of the exposure, the lamp 42 is extinguished, and the exposure device 41 is returned to its initial position in the direction indicated by arrow B. At this time, the filter unit 44 is rotated by a driving source (not shown) so that the green filter 44G is positioned above the lamp 42.

While the exposure device 41 is being returned to its initial position, the exposure table 52 is moved up by rotation of the cam 53 to space the photosensitive recording medium 50 away from the positioning unit 31 and mask member 15R.

Back tension is normally applied to the photosensitive recording medium 50 from the center of rotation of the roll of the photosensitive recording medium 50, by means of a spring biased frictional coupling between the shaft supporting the photosensitive recording medium 50 and a part of the apparatus frame (not shown), located in the cartridge 51. Accordingly, when the exposure table 52 is moved down, the photosensitive recording medium 50 is drawn from within the cartridge 51 by a length corresponding to the distance of downward movement of the exposure table 52, but when the exposure operation is completed and the exposure table 52 is moved up, the photosensitive recording medium 50 is rewound in a direction to take up any resulting slack.

After completion of the exposure by the mask member 15R for red, the exposure table 52 is moved up to the predetermined position by the cam 53. In this instance, since the fastening roller 56 remains in contact with the left end portion of the exposure table 52, the photosensitive recording medium 50 remains fixed with respect to the exposure table 52.

Subsequently, mask member 15G for green is produced by the monochromatic laser printer 1, and when the mask member 15G reaches a position directly forward of the roller pair 24 and past the ADF tray 12, ADF roller 13, recurler roller 101 and mask member transport path 21, the roller pairs 22, 24, 25 and 27 and the roller pairs 32 and 33 of the positioning unit 31 are rotated to transport the mask member 15R in the rightward direction to remove the mask member 15R from the positioning unit 31. Simultaneously, the mask member 15G is transported to and stopped at the exposure position. In this instance, the gates 28 and 29 are at the positions indicated by solid lines. Thus, the mask member 15R after exposure is transported into the upper branch path. Since the route extending from the roller pair 25 to the roller pair 27 past the gate 29 extends substantially linearly, jamming of a mask member 15 rarely occurs. Then, after a trailing end of the mask member 15R passes the gate 29 to allow subsequent changing over of the gate 29 to the position indicated by dotted lines, rotation of the roller pair 27 is stopped. Consequently, the mask member 15R is suspended above the mask member discharge tray 30 as it is partially held by the roller pair 27. Since the mask member discharge tray 30 is provided on a side of the body of the color image recording apparatus 20, the operator has ready access to the mask member 15R in such a standby condition.

The mask member 15G, introduced into the positioning unit 31, is positioned relative to the photosensitive recording medium 50 in the same manner as described for mask member 15R. Exposure table 52 is moved down to bring the mask member 15G into close contact with the glass plate 34 together with the photosensitive recording medium 50. The lamp 42 is then lit to effect an exposure operation with green light by way of the green filter 44G. After completion of the exposure operation, the exposure table 52 is moved up to the predetermined position. The exposure device 41 is moved back to its initial position while the filter unit 44 is moved to position the blue filter 44B above the lamp 42.

Subsequently, a further mask member 15B for blue produced by the monochromatic laser printer 1 is fed into the color image recording apparatus 20 in the same manner as was the case for the mask members 15R and 15G. After the mask member 15B is transported to the position directly forward of the roller pair 24, the roller pairs 24, 22, 25 and 26 and the roller pairs 32 and 33 of the positioning unit 31 are rotated in a direction to transport the mask member 15G in the rightward direction.

Consequently, the mask member 15G is fed from the positioning unit 31 while simultaneously the mask member 15B is transported to and stopped at the exposure position. In this instance, the gate 28 is at the position indicated by solid lines while the gate 29 is at the position indicated by broken lines. The mask member 15G, after exposure, is transported by the roller pair 26 until a trailing end thereof passes the gate 29. Thus, the mask member 15G is held in such a condition that it is partially clamped by the roller pair 26 and suspended above the mask member discharge tray 30.

The mask member 15B introduced into the positioning unit 31, is placed in close contact with the photosensitive recording medium 50 by the operation as described above, and in this condition, the photosensitive recording medium 50 is exposed to blue light.

By the operations as described, a latent image of a desired color image is recorded on the photosensitive recording medium 50. Subsequently, the exposure table 52 is moved up to its initial position. Thereupon, the fastening roller 56 and the left end portion of the exposure table 52 are spaced away from each other to release the photosensitive recording medium 50 and the buffer 55 is moved in the direction indicated by arrow E. As a result of the movement of the buffer 55, an unexposed portion of the photosensitive recording medium 50 is moved to a position below the exposure table 52 as photosensitive recording medium 50 is withdrawn from the cartridge 51.

The drive roller 57 is stopped when a leading end portion of the latent image on the photosensitive recording medium 50 comes to a position adjacent the pressure roller 71 of the pressure developing unit 70.

A color developer sheet 60 is fed from within the cassette 61 by the suction cup 62 in a synchronization with the movement of the photosensitive recording medium 50. The color developer sheet 60 is stopped at a position at which a leading end thereof corresponds to the leading end of the latent image of the photosensitive recording medium 50.

Then, the pressure roller 71 of the pressure developing unit 70 is rotated in the direction indicated by the arrow by a known driving device (not shown) to press, under pressure, the color developer sheet 60 with that portion of the photosensitive recording medium 50 on which the latent image is formed.

Simultaneously, the exposure table 52 is moved down to the predetermined position until the left end thereof is in contact with the fastening roller 56 thereby fixing the photosensitive recording medium 50 to the exposure table 52.

The photosensitive recording medium 50 is then fed, under pressure and in contact with the color developer sheet 60, through developing unit 70. Consequently, those of the microcapsules on the photosensitive recording medium 50 which have not yet been hardened are ruptured by the pressure so that the color contained therein reacts with the developer on the color developer sheet 60 and a color image corresponding to the latent image on the photosensitive recording medium 50 is developed on the color developer sheet 60.

As the pressure roller 71 of the pressure developing unit 70 is rotated further in the direction indicated by the arrow, the buffer 55 moves in the direction indicated by arrow F.

When the leading end of the color developer sheet 60 comes to the separating roller 64, the color developer sheet 60 is peeled away from the photosensitive recording medium 50 and guided toward the thermal fixing unit 80.

In the thermal fixing unit 80, the color developer sheet 60 is heated by air which is heated by the heater 81 and circulated in the casing 83 by the vane wheel 82, thereby promoting color development of the color image of the color developer sheet 60. Simultaneously, a binder polymer (binding resin), for fixing the color developing medium to base paper of the color developer sheet 60, is melted by heat, and consequently, the surface of the color developer sheet 60 becomes smooth and produces a suitable degree of gloss.

The color developer sheet 60, after completion of the color developing and glossing processing, is then discharged into the discharge tray 63.

During the series of operations, including initial pressurized developing, promotion of color development and glossing as described above, the photosensitive recording medium 50 remains held between and fixed by the exposure table 52 and fastening roller 56. Consequently, while the developing processing for a picture is proceeding, exposure processing of a latent image for another color image can be performed on the exposure table 52.

When exposure for a second color image is to be performed using the previously used mask members 15, the mask member 15B at the exposure position is fed out in the leftward direction while the mask member 15R held at the position of the roller pair 27 is fed back into the positioning unit 31.

Accordingly, the roller pairs 24, 22, 25 and 27 and the roller pairs 32 and 33 of the positioning unit 31 are controlled to rotate to transport the mask member 15R in the leftward direction. In this instance, the gates 28 and 29 are at the positions indicated by solid lines in FIG. 1. The mask member 15B is held between the roller pair 24 and passes the gate 28, and when at a position at which a trailing end of mask member 15B has passed the gate 28, rotation of the roller pair 24 is stopped. Consequently, the mask member 15B is retained at that position by roller pair 24. Mask member 15R, fed into the positioning unit 31, is then positioned as described above, and the photosensitive recording medium 50 is exposed to red light when in close contact with the mask member 15R. Subsequently, the mask member 15R is fed out in the leftward direction from the exposure position while the mask member 15G, held by the roller pair 26, is fed into the positioning unit 31. In particular, the roller pairs 23, 22, 25 and 26 and the roller pairs 32 and 33 of the positioning unit 31 are rotated to transport the mask members 15R and 15G in the leftward direction. In this instance, the gates 28 and 29 are at the positions indicated by broken lines. The mask member 15R is thus held between and fed by the roller pair 23. After a trailing end of mask member 15R passes the gate 28, rotation of the roller pair 23 is stopped and the mask member 15R is held in the mask member accommodating section 125. Mask member 15G, fed into the positioning unit 31, is positioned and then photosensitive recording medium 50 is exposed to green light while in close contact with the mask member 15G. Subsequently, the mask member 15G is fed out in the rightward direction from the exposure position, and then a similar operation is performed to feed the mask member 15B held at the position of the roller pair 24 into the positioning unit 31 in place of the mask member 15G and the photosensitive recording medium 50 is exposed to blue light while in close contact with mask member 15B. As a result, the latent image of the color image is formed on the photosensitive recording medium 50 and the color image is sequentially formed on a color developer sheet 60 as described above. By repeating a similar sequence of operations, a desired number of color images can be produced from a single set of mask members.

After the required number of color images have been produced from the same mask members 15, the mask members 15 are discharged into the discharge tray 30 from the roller pair 27 or roller pair 26.

Further, in case a second set of mask members 15 are output from the monochromatic laser printer 1 while exposure processing of a series of color images from the first set of mask members 15 is proceeding, the second set of mask members 15 are stored in the ADF tray 12. Then, the stored mask members 15 are subsequently fed one by one into the color image recording apparatus 20 by the ADF roller 13 after the exposure processing for the preceding set of mask members 15 is completed.

Further, in the case of a set of mask members 15 produced from another monochromatic laser printer or a set of mask members 15 which have been used previously and are to be used again, manual insertion of the mask members 15 into the ADF tray 12 is possible.

Figure 3:
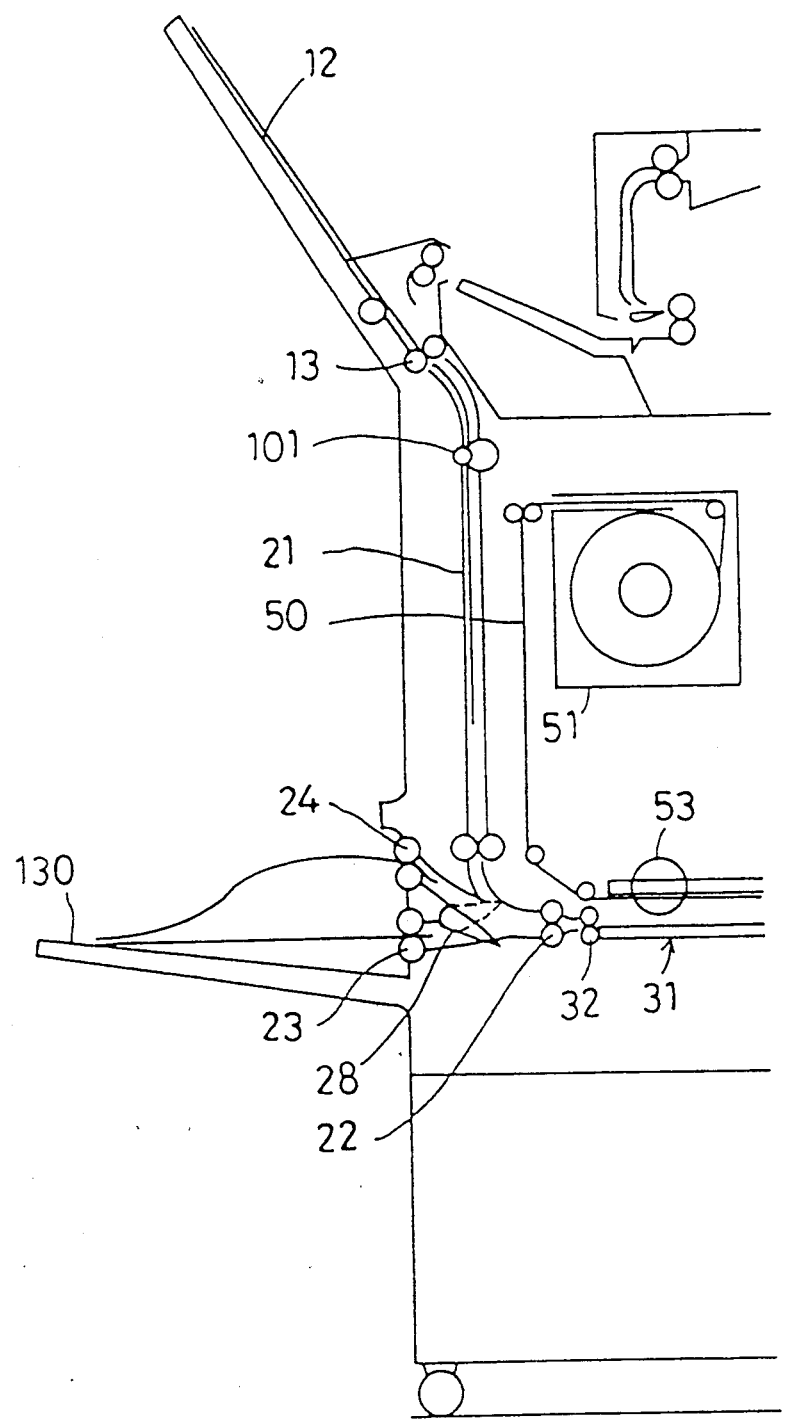
FIG. 3 shows a part of an image forming apparatus according to another embodiment of the present invention.
Figure 4:
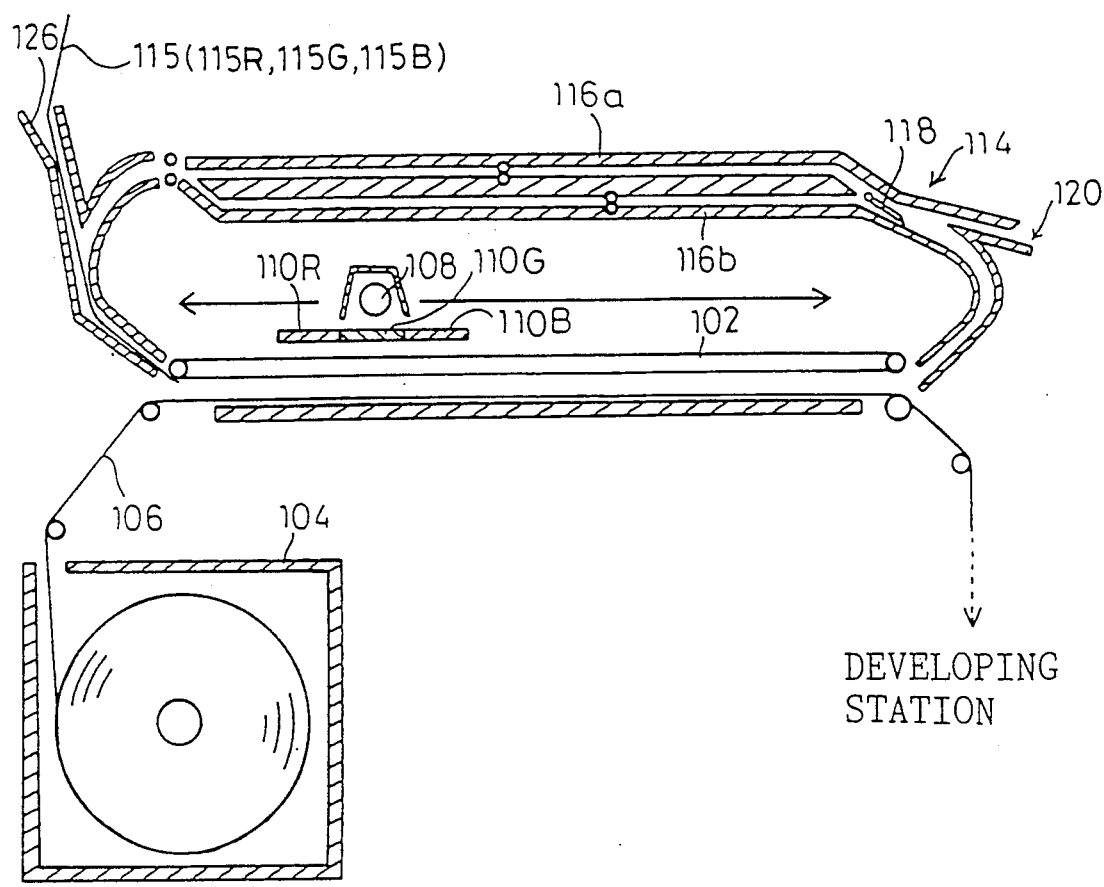
FIG. 4 is a sectional view especially showing a path of a mask original according to the related art.

Alternatively, another form of transportation or feed path for the mask members is shown in FIG. 3. In this embodiment, the left-hand side portion of the color image recording apparatus is modified as shown. Such a modification permits further linear configuration of the transport path for the mask member.

It is to be noted that the various members shown in FIG. 3 individually operate in a manner similar to the members denoted by like reference numerals in FIG. 1. In short, in this second embodiment, the left-hand side holding positions for a mask member are similar to that on the right-hand side and described with respect to the primary embodiment. While the path for a mask member from the monochromatic laser printer 1 is used as a holding position in the primary embodiment, as well as mask member accommodating Section 125, mask members are retained in a position suspended over the tray 130 in this second embodiment.

Many changes and modifications can be made to the embodiments of the present invention as described without departing from the spirit and scope of the invention as set forth herein.

As apparent from the foregoing description, according to the present invention, a mask member can be held or stored without forming the path for retaining the mask member into a loop. Consequently, the probability of jam occurring is can be reduced and, when it occurs, can be readily corrected thereby providing the advantage that a plurality of images can be formed at a high speed from a single set of mask members.

What is claimed is:

1. An image forming apparatus for forming an image on a photosensitive recording medium by exposure to light through a plurality mask members in sequence, each mask member sequentially placed on an exposure position, said apparatus comprising:

a plurality of holding positions linearly connected to said exposure position to each of which one of said mask members is selectively moved and held; and transport means for transporting said mask members from said exposure position, to said holding positions and returning said mask members to said exposure position.

2. An image forming apparatus as claimed in claim 1, further comprising gate means provided between said exposure position and said holding positions for selectively directing one of said mask members into one of said holding positions.

3. An image forming apparatus as claimed in claim 2, wherein said plurality of holding positions are substantially outside of the apparatus.

4. An image forming apparatus as claimed in claim 3, further comprising a holding means provided on an outer side of said gate means, and wherein said mask member is partially clamped by said holding means after a tail edge of said mask member passes said gate means.

5. An image forming apparatus as claimed in claim 4, further comprising a discharge tray over which a major portion of said mask member clamped by said holding means is suspended.

6. An image forming apparatus as claimed in claim 4, wherein said holding means comprises a roller pair.

7. An image forming apparatus as claimed in claim 1, wherein said exposure position includes a glass plate and exposure table, and wherein said retracting positions are linearly connected to a path located between said glass plate and exposure table.

8. An image forming apparatus as claimed in claim 1, further comprising an exposure lamp wherein a selected one of said mask members and said photosensitive recording medium are closely contacted with each other at said exposure position and said photosensitive recording medium is exposed to light emitted from said exposure lamp through said selected mask member.

9. An image forming apparatus as claimed in claim 8, wherein said image formed on said photosensitive medium is a latent image, and said apparatus further comprises:
   a developer medium supplying means for supplying a developer medium which reacts with said photosensitive medium; and
   developing means to which said recording medium and said developer medium are supplied for forming a visible image on said developer medium corresponding to said latent image.

10. An image forming apparatus as claimed in claim 9, wherein said plurality of mask members comprise three members having mask images each corresponding to a primary color, and wherein said latent image corresponds to a color image formed on said recording medium whereby a color image is formed on said developer sheet.

11. A mask member feed apparatus for an image forming machine for producing multiple color copies of original color images from a plurality of mask members sequentially used to expose a photosensitive recording medium to light, said apparatus comprising:
   an exposure position;
   a plurality of holding positions linearly connected to said exposure position, wherein each one of said plurality of mask members may be moved to and held in one of said plurality of holding positions;
   transport means for moving each of said plurality of mask members to and from said exposure position and said holding positions.

12. A mask member feed apparatus as claimed in claim 11, further comprising gate means for directing each one of said plurality of mask members to one of said plurality of holding positions.

13. A mask member feed apparatus as claimed in claim 12, further comprising holding means at each of said plurality of holding positions for holding an end of said mask member closest to said exposure position.

14. A mask member feed apparatus as claimed in claim 13, wherein at least two of said plurality of mask members have a substantial portion extending beyond said holding means outside the image forming machine.

15. A mask member feed apparatus as claimed in claim 11, wherein a path between each of the linearly connected said plurality of holding positions and said exposure position deviates from a line parallel to said exposure position by no more than 90°.

16. An image forming apparatus for producing multiple color copies from a color original by means of a set of mask members sequentially used to expose a recording medium to light, said apparatus comprising:
   an exposure position;
   a feed means for initially feeding in sequence each mask member of the set of mask members to said exposure position;
   transport means for moving each mask member into position on said exposure position and subsequently removing the mask members after exposure;
   a plurality of holding positions each linearly connected to said exposure position by a transport path containing a bend of no more than 90°, said transport means also moving the mask member between said exposure position and a holding position;
   gate means for directing the mask member between said exposure position and said holding position; and
   holding means for retaining the mask member at said holding position.

17. An image forming apparatus as claimed in claim 16, wherein at least two of said plurality of holding positions hold the mask member in a position where a major portion of the mask member is outside the apparatus.

* * * * *